United States Patent [19]

French

[11] 4,047,216
[45] Sept. 6, 1977

[54] HIGH SPEED LOW CAPACITANCE CHARGE COUPLED DEVICE IN SILICON-SAPPHIRE

[75] Inventor: Barry T. French, Ontario, Calif.

[73] Assignee: Rockwell International Corporation, El Segundo, Calif.

[21] Appl. No.: 650,594

[22] Filed: Jan. 20, 1976

Related U.S. Application Data

[63] Continuation of Ser. No. 457,675, April 3, 1974, abandoned.

[51] Int. Cl.² .................... H01L 29/78; G11C 19/28; H01L 27/12
[52] U.S. Cl. ............................... 357/24; 307/221 D; 357/4; 357/49; 357/89
[58] Field of Search .................. 357/4, 23, 24, 49, 89; 307/221 D

[56] References Cited

U.S. PATENT DOCUMENTS

| | | | |
|---|---|---|---|
| 3,660,697 | 5/1972 | Berglund et al. | 357/24 |
| 3,704,376 | 11/1972 | Lehovec et al. | 357/24 |
| 3,784,847 | 1/1974 | Kurz et al. | 357/24 |
| 3,796,927 | 3/1974 | Boyle et al. | 357/24 |

OTHER PUBLICATIONS

Chan "Fabrication and Operation of CCD Structure with Silicon Grown on Sapphire Substrates" IEEE Int. Electron Devices Meeting Tech. Dig., (12/73) pp. 469–472.

Tompsett et al. "Charge Coupled 8-Bit Shift Register" Applied Physics Letters, vol. 17 (8/70) pp. 111–115.

Appels et al. "Local Oxidation of Silicon and its Application . . ." Philips Res. Repts., vol. 25 (4/70) pp. 118–132.

*Primary Examiner*—William D. Larkins
*Assistant Examiner*—Gene M. Munson
*Attorney, Agent, or Firm*—H. Fredrick Hamann; G. Donald Weber, Jr.; Robert Ochis

[57] ABSTRACT

A charge coupled device (CCD) built in a semiconductor island on sapphire substrate has very low gate capacitances and consequently will operate at very high speeds.

2 Claims, 9 Drawing Figures

HIGH SPEED LOW CAPACITANCE CHARGE COUPLED DEVICE IN SILICON-SAPPHIRE

This is a continuation of application Ser. No. 457,675 filed Apr. 3, 1974, now abandoned.

BACKGROUND OF THE INVENTION

1. Field of the Invention

This invention relates to the field of charge coupled devices (CCD's), and more particularly to the field of high speed charge coupled devices.

2. Description of Prior Art

Charge coupled devices built in bulk silicon are well-known in the prior art. Such charge coupled devices operate at moderate speeds. Significant problems are encountered in attempting to operate such charge coupled devices at very high speeds or with low-power propagation systems. To a significant extent these problems are a result of relatively large gate electrode to substrate capacitances which restrict the rise time of propagation waveforms and which consume a significant portion of the power of the propagation control signals applied to the gates.

SUMMARY OF THE INVENTION

The problems of the prior art are overcome by construction of charge coupled devices in narrow islands or strips of a semiconductor material on a sapphire substrate. The semiconductor material is preferably deposited with a thin high conductivity film of the semiconductor in contact with the sapphire. A thicker layer of lower conductivity semiconductor overlies the high conductivity film. The high conductivity film serves as a ground plane for the charge coupled device to provide well defined control voltages. The semiconductor islands are preferably restricted to the width desired for the propagation channel so that only that portion of each control gate which is active in the control of propagation within the channel overlies the semiconductor island. The lead-in and interconnection portions of the gate structure which constitute a majority of the gate area overlie dielectric materials and are effectively isolated from the semiconductor material of which the channel is formed. This eliminates the gate-to-substrate capacitance associated with the "nonactive" portions of the gate electrodes where charge coupled devices are constructed in bulk semiconductors. Interelectrode capacitance remains, but is minimal compared with the gate-to-substrate capacitance found in bulk devices.

DETAILED DESCRIPTION OF THE PREFERRED EMBODIMENT

Figure 1:
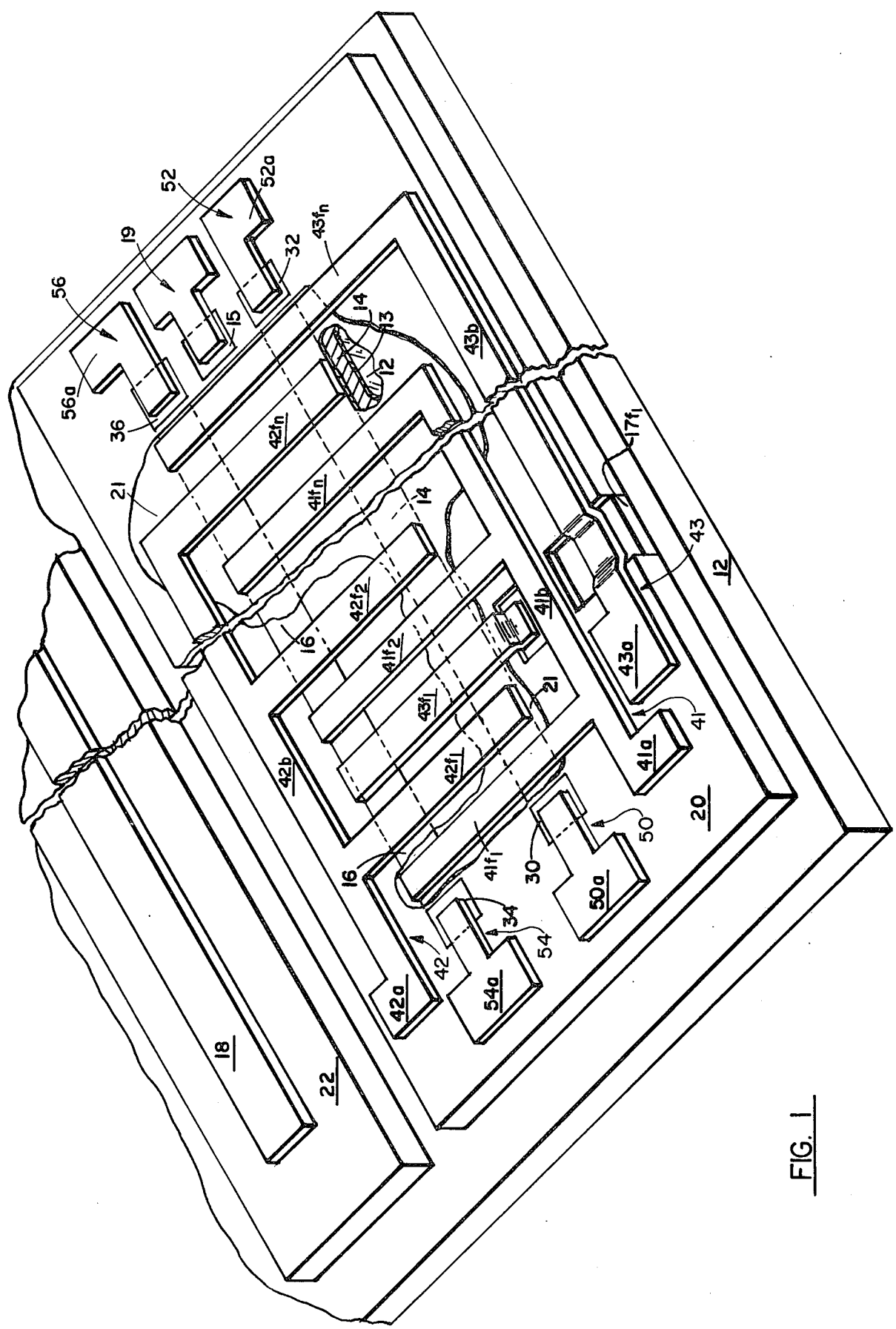
FIG. 1 is a perspective, partially cutaway view of several charge coupled devices in accordance with the preferred embodiment of the invention.

Reference is here made to FIG. 1 of the drawings. A substrate 12 of sapphire or other appropriate insulating material serves as a supporting substrate for a plurality of perferably monocrystalline silicon strips 14, 16 and 18.

It will be understood that any suitable semiconductor material may be employed for the construction of the charge coupled device of this invention. However, the embodiment described will be described in terms of silicon semiconductor material.

A high conductivity film 13 of silicon material preferably underlies the charge propagation strips 14 and 16. Contact is provided to this film by a contact 19 to a contact diffusion 15. The layer 13 provides several benefits in a silicon on sapphure CCD. First, it provides a ground plane under the charge transfer channel. The ground plane assures that the application of a given voltage to a control gate produces a potential well with given characteristics independent of the location of the gate along the channel. Second, where the silicon layer is sufficiently thin, the CCD can be operated with all potential wells extending completely through the low conductivity channel to the high conductivity ground plane. Such permanent positioning of the potential well eliminates contributions to charge transfer inefficiency which result from the filling and emptying of traps as the potential well extends into and contracts from the low conductivity region. Such problems are inherent in charge coupled devices constructed in bulk semiconductor materials, but can be eliminated in accordance with the present invention. The potential wells are prevented from migrating back and forth across the low conductivity region by the fact that only a small portion of the gate voltage appears across the low conductivity region in the described structure.

Although the high conductivity film increases the benefit of the inventive device construction, the construction still provides many of its benefits if the film is omitted or made less conductive.

Layers 20 and 22 of appropriate dielectric material such as silicon dioxide are provided adjacent the single crystalline silicon strips 14 and 16 in order to provide an essentially planar support surface for the gate metallization. Although dielectric layers 20 and 22 are not essential to the proper operation of the device, they are included in order to minimize the metallization defects which often result from deposition of metallization across the edge of a mass structure such as silicon on sapphire.

P-N diodes 30 and 34 are preferred as the charge sources for CCD propagation channels 14 and 16, respectively. Input diodes 30 and 34 are contacted by input electrodes 50 and 54, respectively. Diodes 32 and 36 serve as charge sensing devices for channels 14 and 16, respectively and are contacted by output electrodes 52 and 56, respectively.

Each of the electrodes 50, 52, 54, and 56 is shown with an enlarged pad portion with 50a, 52a, 54a and 56a, respectively. These enlarged pad areas are not necessary for the operation of the device, but rather are provided for more reliable connections to external circuitry.

A dielectric layer 21 insulates silicon channels 14 and 16 from a plurality of overlying propagation gates 41 through 43. Each of the propagation control gates 41-43 has a corresponding enlarge connection pad portion 41a-43a, respectively. These pads are provided for reliable connection to external circuitry. Each of the gates comprises a portion 41b, 42b, or 43b respectively, substantially parallel to the propagation channels 14 and 16 for interconnecting gate fingers which extend perpendicular to the propagation channels. For gate 41 these fingers are denominated $41f_1$, $41f_2$, $41f_n$. . . . The fingers of gates 42 and 43 are similarly denominated. The fingers of the gates are interdigitated along the length of the channel in the order $41f_1$, $42f_1$, $43f_1$, $41f_2$, $42f_2$, $43f_2$ and so on. Those skilled in the art will readily recognize that this gate structure comprises a three phase propagation control system. The control gate fingers extending across the charge propagation channels are illustrated as a planar electrode pattern, and for clarity of illustration are illustrated as widely separated. However, it will be recognized that any desired gate pattern may be employed without departing from the scope of the invention. Because of the use of a three phase gate system, a metallization crossover or crossunder is required in order to properly connect the gates. This may be achieved as illustrated in FIG. 1 where a silicon crossunder $17f_1$ is provided in alignment with finger $43f_1$. The portion 41b of gate 41 is spaced from crossunder $17f_1$ by the dielectric layer 21 which overlies the channels. Consequently, in this configuration in order to assure good conduction through crossunder $17f_1$ it must either be heavily doped to prevent inversion thereof by the voltage on gate 41 or it must be made of silicon material of the opposite conductivity type to the channel regions 14 and 16 in order that any voltage applied to gate 41 does not produce an inversion effect in crossunder $17f_1$. Alternatively the dielectric layer 21 can be made thicker over the crossunders 17f to reduce the influence of the voltage on gate 41 on the conductivity of the crossunders 17f.

It will be observed from reference to FIG. 1 that the only portion of each gate electrode 41-43 which is capacitively coupled to silicon material which is conductively connected to the channels is the portion of each of the fingers 41f-43f which overlie the propagation channels 14 and 16 themselves. This overlying relationship results in the capacitive coupling between the gate fingers and the channel which is necessary in order to control charge storage and propagation within the channel. Other than those portions of the gate electrodes which overlie the propagation channels 14 and 16, there is very little capacitance associated with the gate electrodes. What little capacitance there is associated with electrodes is in the nature of interelectrode capacitances which are minimal and gate-electrode crossunder capacitances. It will be noted that these capacitances are drastically lower than the gate-to-silicon capacitances present in bulk silicon devices. The elimination of the gate-to-silicon capacitances results in a significant reduction in the power necessary to drive the control gates.

Figure 2:
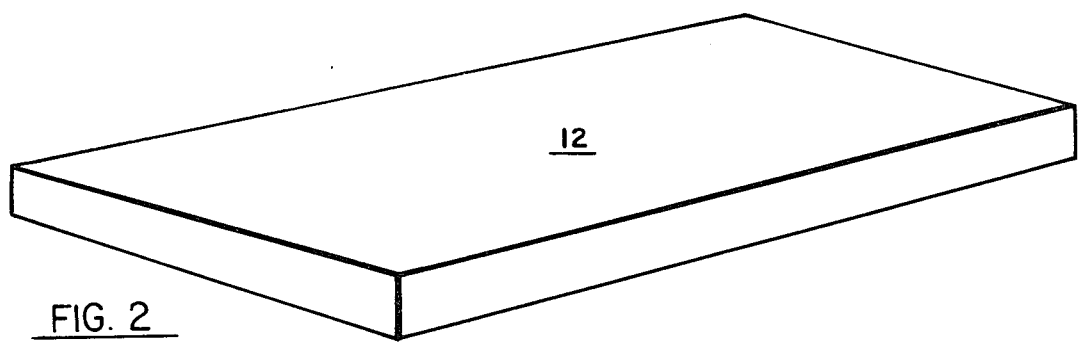
FIG. 2 illustrates a polished sapphire substrate which is ready for the deposition of a silicon layer.
Figure 3:
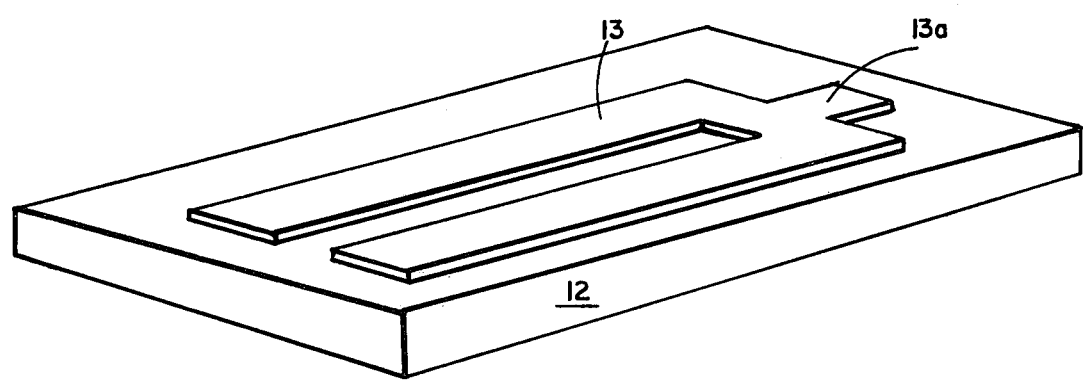
FIG. 3 illustrates a composite comprised of the sapphire substrate and a continuous layer of single crystal silicon deposited thereon.
Figure 4:
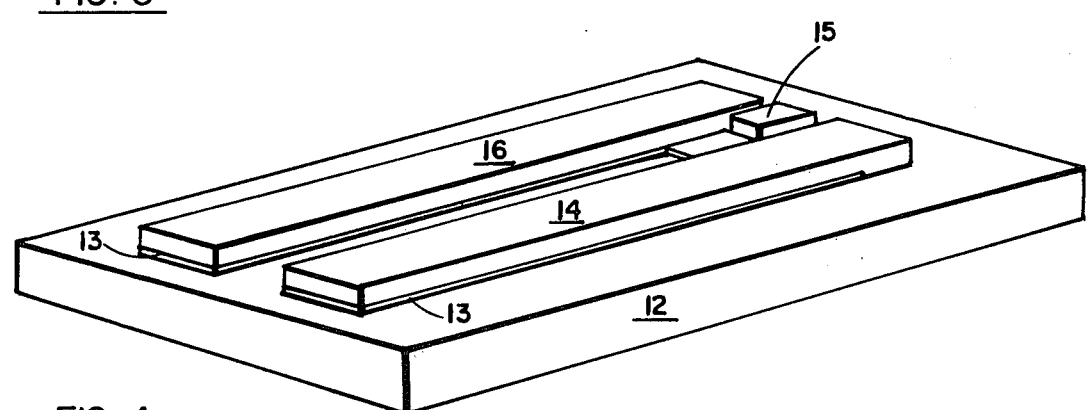
FIG. 4 illustrates a composite comprised of the sapphire substrate and two single crystalline silicon strips or channels thereon.
Figure 5:
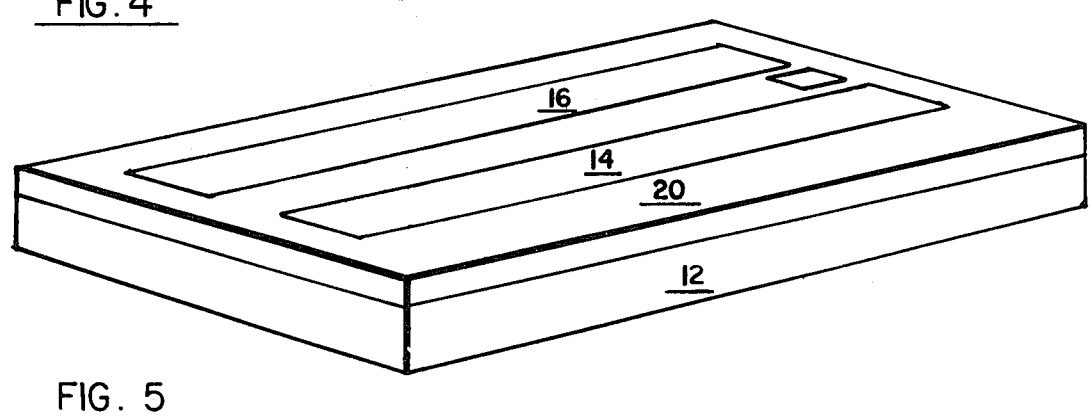
FIG. 5 illustrates a composite comprised of the sapphire substrate, two single crystalline silicon charge coupled device channels thereon and a layer of dielectric adjacent the silicon channels and the sapphire substrate.

The above-described embodiment of the invention may be formed in the following fashion. First, a sapphire substrate having substantially planar, polished surface is prepared for the growth of monocrystalline silicon in an appropriate manner. Such a sapphire substrate is illustrated in FIG. 2. A continuous single crystalline film of high conductivity silicon is then deposited on sapphire substrate 12. In the illustrated embodiment, the silicon is N type. The high conductivity silicon preferably has a carrier density of $10^{18}$ to $10^{19}$ carriers per cubic centimeter. The high conductivity film is then etched so that it remains only in those areas where it is desired to have a charge coupled device channel. The portion of the high conductivity layer remaining after the etch is illustrated as layer 13 in FIG. 3. The high conductivity film 13 is defined with a contact portion 13A which is preferably offset from the portions of the film 13 which will be subjacent to charge transfer channels. The final configuration of layer 13 has been described as being formed by the etching of a continuous film. However, if desired, the deposition of the high conductivity film may be restricted to its final outline by appropriate masking. Subsequent to the definition of high conductivity film 13, low conductivity material of the same conductivity type is deposited thereover to form charge transfer channels. It is preferred, for reasons to be explained hereinafter, that the low conductivity material extend beyond the high conductivity material at both ends of each channel. The device structure after the deposition of two charge transfer channels 14 and 16 is illustrated in FIG. 4.

A portion of the silicon, 15, is deposited on the contact portion 13A of the high conductivity film. The contact portion 15 allows for subsequent formation of a metallization contact to the film 13 without a large mesa step in the metallization layer as will be described hereinafter.

The charge transfer channels 14 and 16, although preferably monocrystalline, need not be strictly single crystalline. The transfer channels 14 and 16, however, must be suitable for charge coupled device fabrication operation. It is generally preferred, that the semiconductor material in a CCD charge transfer channel be doped with a carrier density of less than $10^{16}$ carriers per cubic centimeter.

A dielectric layer 20 such as silicon dioxide may be deposited on the sapphire substrate adjacent to semiconductor strips 14 and 16, contact 15 and any crossunder regions 17 required by the selected gate electrode patterns. Dielectric layer 20 is deposited to produce a substantially planar upper surface common to the dielectric layer 20 and the silicon regions 14, 15, 16, and 17. Contact region 15 and crossunders 17 are heavily doped to provide high conductivity regions. This doping may be accomplished by diffusion, ion implanatation or deposition separately from strips 14 and 16. Input and output diodes 30, 32, 34 and 36 (FIG. 1) are formed by an appropriate method such as diffusion or ion implanatation into strips 14 and 16. A dielectric layer 21 is then deposited over at least the silicon channels 14 and 16. If desired, for convenience dielectric layer 21 may be deposited over the entire structure. Layer 21 will serve as the gate insulator in the completed device. Consequently, the thickness of layer 21 is controlled to provide the desired charge control voltage sensitivity and an adequate dielectric breakdown voltage.

Once the dielectric layer 21 has been deposited over silicon channels 14 and 16, holes are etched through this layer to provide contact openings to the input and output diodes. Contact openings are also formed over contact region 15 and crossunders 17 if dielectric layer 21 was deposited thereover. A layer of metallization may then be deposited over the entire device. The metallization layer is then masked and etched to produce the separate control and contact electrodes as illustrated in FIG. 1. With the control electrode layout illustrated in FIG. 1 double layer metallization is avoided by the use of the silicon crossunder connector strips 17. However, if a multilayer metallization electrode pattern is preferred, crossunders 17 may be omitted. Where double layer metallization is to be used, a second dielectric layer is deposited over the first metallization after it is etched. Thereafter the second metallization layer is deposited, masked and etched.

If desired, the device may also be formed by retaining high conductivity film 13 as a continuous film over the entire substrate. Thereafter, a continuous low conductivity layer of silicon may be deposited over layer 13. The device structure may then be defined by an appropriate mask and etched.

If it is considered desirable, such a continuous layer of silicon may be masked to protect the desired channels 14 and 16, contact 15 and any crossunder connector 17. Thereafter, the remaining unprotected silicon may be converted into silicon dioxide insitu to provide the required isolation between the channels and the desired reduction of gate electrode to "substrate" capacitance and a planor surface for metallization.

If a procedure is used which yields a film 13 under the entirety of the low conductivity silicon, then great care must be taken when the input and output diodes are formed. To assure that the breakdown voltage between the diodes and the high conductivity film is sufficient to allow efficient charge injections and collection, the p-type region of the diode must be spaced from the high conductivity N-type film 13 by about 2 microns of low conductivity N-type silicon.

Where a thin silicon layer 14 or 16 is employed, the required separation is best provided by forming the diode in a region which lacks the underlying high conductivity film. This can be accomplished by having the ends of the strips 14 and 16 extend beyond film 13 as described above.

Figure 6:
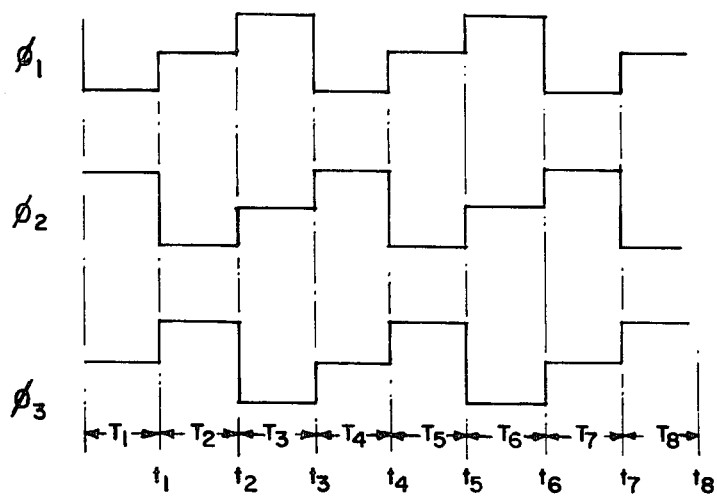
FIG. 6 illustrates the preferred waveforms of clock voltages for driving charge coupled devices in accordance with the invention.

The set of voltage waveforms illustrated in FIG. 6 may be applied to the control gates of the FIG. 1 device in order to control charge transfer within the charge propagation channels. In order to propagate charge from the left-hand end of a channel to the right-hand end of a channel the $\phi_1$ waveform is applied to gates 41, the $\phi_2$ waveform is applied to the gates 42 and the $\phi_3$ waveform is applied to the gates 43. If it is desired to propagate charge from the right-hand end of a channel to the left-hand end of a channel the $\phi_1$ waveform is applied to the gates 43, the $\phi_2$ waveform is applied to the gates 42 and the $\phi_3$ waveform is applied to the gates 41.

Figure 7A:
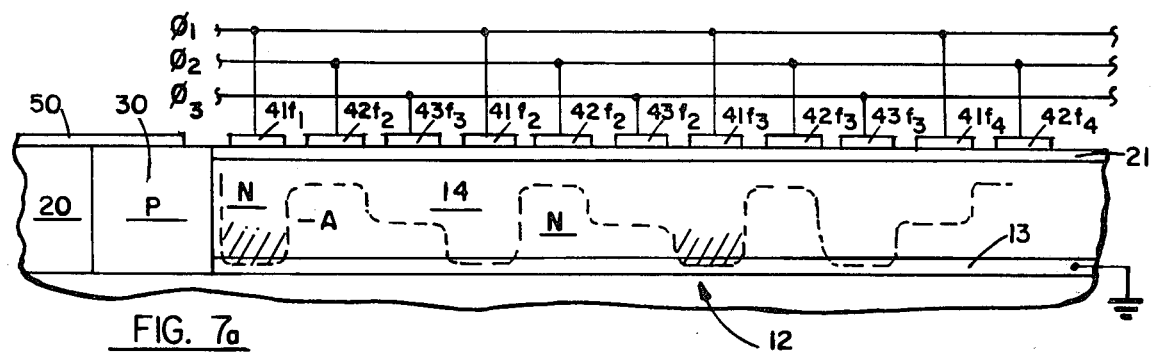
FIGS. 7(a-c) illustrates the propagation of potential wells and charge packets along a silicon channel.

The potential well configuration within charge propagation channel 14 in time periods $T_1$, $T_4$, $T_7$ . . . is illustrated in FIG. 7a. In time period $T_1$, during which the $\phi_1$ signal (applied to gate 41) is at its most negative value, charge flow into the potential well adjacent to the input diode is controlled by the bias conditions of the diode. If the diode is forward biased, then the potential well formed under the adjacent gate $41f_1$ will fill with charge. Conversely, if the diode is backbiased, very little, if any, charge will flow into the potential well adjacent to the input diode.

Figure 7B:
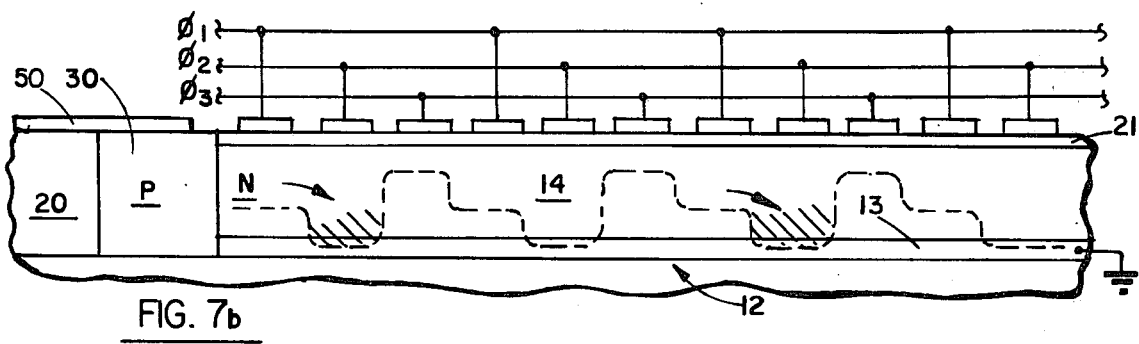

At time $t_1$, the clock signals change from their values in time period $T_1$ to their values in time period $T_2$. In time period $T_2$ the most negative control voltage is applied to the gate 42 by the $\phi_2$ clock signal. As illustrated in FIG. 7b, this produces a deep potential well subjacent each gate finger $42f_i$. This deep potential well attracts any charge in the potential well under the adjacent gate finger $41f_i$, since the depth of the potential well subjacent gates $41f_i$ has been reduced by the increased voltage of the $\phi_1$ clock signal in the $T_2$ clock period.

The conditions during the filling of the potential well adjacent the input diode are preferably controlled so that the potential well only fills half full or to the level A illustrated in FIG. 7a. Under these conditions, when the clock signals change at time $t_1$ no charge will be boosted out of the potential well under electrode $41f_1$. However, the decrease in the depth of the potential well under gate electrode $41f_1$ when combined with the creation of a deeper potential well under adjacent electrode $42f_1$ causes the charge under electrode $41f_1$ to flow by drift and diffusion into the potential well under electrode $42f_1$. The difference in the potential within these adjacent wells is such that once a charge drifts or diffuses into the well under electrode $42f_1$ it cannot return to the well under electrode $41f_1$.

Figure 7C:
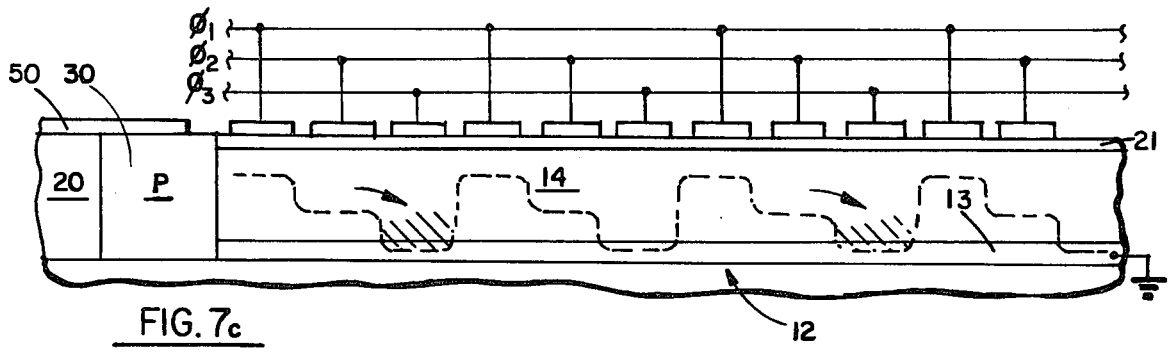

When the clock signals change at time $t_2$, the potential well under each electrode $41f_i$ is eliminated or at least drastically reduced in depth as illustrated in FIG. 7c. Simultaneously, the depth of the potential well under each electrode $42f_i$ is decreased by the decreased potential applied to gate electrode 42 and a deep potential well is created under electrode $43f_i$ by application of the maximum negative voltage to gate electrode 43. As an result of these potential well changes, any charge which was in a potential well under electrode $42f_i$ flows by drift and diffusion into the potential well under electrode $43i F_i$.

The above charge transfer process is repeated each time the clock signals change. This causes a uni-directional transfer of charge packets along silicon channel 14. Each time a deep potential well is formed adjacent to input diode 30, that well may be filled with charge by forward biasing the diode or may be retained empty of charge by backbiasing the diode. Thus information may be selectively entered into the charge transfer channel in the form of charge packets and the absence of charge.

The maximum benefits of this invention are obtained by the above described preferred procedure of limiting each semiconductor strip to single a charge transfer channel width. However, many of the benefits are still obtained if the strip is a plurality of channels wide. In a strip which is a plurality of channels wide, the individual channels may be definited by channel stop diffusions or by removal of most of the semiconductor material between the channels. Where a multichannel strip is employed, many benefits of the invention are retained so long as the connection pad and lead-in portions of the gate electrodes are not disposed over semiconductor material.

Thus, there has been shown and described a preferred embodiment of the instant invention. This embodiment is not intended to be limitative but is illustrative only. Those skilled in the art may be able to modify the embodiment described. Nevertheless, any modifications falling within the purview of the description are intended to be included within the scope of this invention which is limited only by the claims appended hereto.

What is claimed is:

1. In combination:
   an electrically insulating substrate;

a strip of material capable of supporting charge coupled device action disposed on said substrate and comprising a charge transfer channel of a charge coupled device;

said strip including a first layer of semiconductor material adjacent said substrate having relatively high conductivity and a second layer of semiconductor material which has a relatively low conductivity;

insulation means disposed on said strip of material and on said substrate;

a set of charge coupled device control electrodes disposed on said insulation means for controlling the transfer of charge within said charge transfer channel when appropriate control signals are applied thereto;

said insulation being thick enough to insulate said control electrodes from said underlying strip of material and thin enough to enable control signals applied to said set of charge coupled device control electrodes to control the transfer of charge within said charge coupled device; and said second layer of semiconductor material is thin enough that when control potentials are applied to the device, all of potential wells of the charge coupled device will extend substantially entirely through said second layer at all times whereby variations in the depths of the potential wells are accommodated by variations in the depth of the penetration of said potential wells into said first layer of semiconductor material whereby transfer inefficiencies induced by traps in the second layer of said semiconductor material are minimized by avoiding repetitive filling and emptying of those traps.

2. A charge coupled device system comprising:

a charge coupled device having a charge transfer channel, said device comprising:

an electrically insulating substrate;

a layer of semiconductor material disposed on said substrate, said layer of semiconductor material comprising said charge transfer channel, said layer of semiconductor material comprising a first film adjacent said substrate having a higher conductivity than a second film which comprises the remainder of said layer;

a layer of insulating material disposed on said layer of semiconductor material;

a set of charge coupled device control electrodes disposed on said layer of insulating material for controlling transfer of charge within said charge transfer channel when appropriate control signals are applied thereto; and said layer of insulating material being thick enough to insulate said control electrodes from said underlying semiconductor material and thin enough to enable control signals applied to said set of charge coupled device control electrodes to control the transfer of charge within said charge coupled device;

control means for generating and applying control signals to said control electrodes wherein the minimum potential applied to the control electrodes during operation of the device is sufficient to cause the potential well in the charge transfer material thereunder to extend at least substantially all the way through said second film and into said first film; and said first film being sufficiently thick and of sufficiently high conductivity to enable the variations in potential which are necessary to effect the controlled transfer of charge in said charge coupled device to be accomodated by variations in the depth of penetration of potential wells into said first film.

* * * * *